United States Patent
Shin et al.

(10) Patent No.: US 12,012,520 B2
(45) Date of Patent: Jun. 18, 2024

(54) COMPOSITION FOR ENCAPSULATING ORGANIC LIGHT EMITTING DIODES AND ORGANIC LIGHT EMITTING DISPLAY DEVICE COMPRISING THE SAME

(71) Applicant: Solus Advanced Materials Co., Ltd., Iksan (KR)

(72) Inventors: Hwangyu Shin, Yongin (KR); Seungjoo Noh, Yongin (KR); Jaehoon Lee, Yongin (KR); Choonghahn Kim, Yongin (KR)

(73) Assignee: SOLUS ADVANCED MATERIALS CO., LTD., Iksan (KR)

( * ) Notice: Subject to any disclaimer, the term of this patent is extended or adjusted under 35 U.S.C. 154(b) by 103 days.

(21) Appl. No.: 17/766,733

(22) PCT Filed: Mar. 18, 2022

(86) PCT No.: PCT/KR2022/003804
§ 371 (c)(1),
(2) Date: May 27, 2022

(87) PCT Pub. No.: WO2022/211333
PCT Pub. Date: Oct. 6, 2022

(65) Prior Publication Data
US 2023/0287221 A1     Sep. 14, 2023

(30) Foreign Application Priority Data
Apr. 2, 2021   (KR) .......................... 10-2021-0043620

(51) Int. Cl.
*C09D 4/00* (2006.01)
*H10K 50/844* (2023.01)

(52) U.S. Cl.
CPC ............. *C09D 4/00* (2013.01); *H10K 50/844* (2023.02)

(58) Field of Classification Search
CPC .... C68F 220/1811; C09D 4/00; H01K 50/844
See application file for complete search history.

(56) References Cited

FOREIGN PATENT DOCUMENTS

| | | | | |
|---|---|---|---|---|
| CN | 107452889 A | * | 12/2017 | .............. C08F 20/18 |
| JP | 2006124698 A | | 5/2006 | |
| JP | 2000057580 A | | 4/2020 | |
| JP | 2020076052 A | | 5/2020 | |
| KR | 20200038631 A | | 4/2020 | |
| WO | 2016043268 A1 | | 3/2016 | |
| WO | WO2016068415 A1 | * | 5/2016 | ................ C08F 2/50 |
| WO | 2018051732 A1 | | 3/2018 | |
| WO | 2018101252 A1 | | 6/2018 | |

OTHER PUBLICATIONS

An OA issued by the Japan Patent Office.
International Search Report dated Jul. 4, 2022.
OA dated on Mar. 24, 2023 by the PTO(CN).

\* cited by examiner

*Primary Examiner* — Khanh T Nguyen
(74) *Attorney, Agent, or Firm* — Harvest IP Law, LLP

(57) ABSTRACT

The present invention relates to a composition for encapsulating an organic light-emitting device and an organic light-emitting display device including the composition. The composition effectively blocks moisture or oxygen flowing into the display device, thereby securing the performance and lifespan of the organic light emitting device. The composition has a low dielectric constant to improve the touch sensitivity of a touch panel.

7 Claims, 1 Drawing Sheet

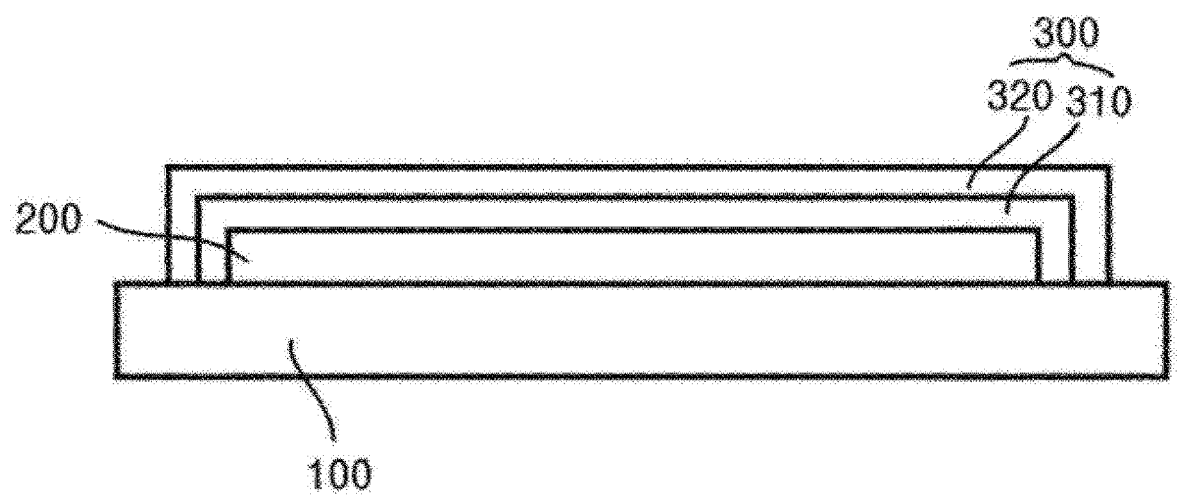

COMPOSITION FOR ENCAPSULATING ORGANIC LIGHT EMITTING DIODES AND ORGANIC LIGHT EMITTING DISPLAY DEVICE COMPRISING THE SAME

TECHNICAL FIELD

The present invention relates to an organic light-emitting device encapsulation composition having a low dielectric constant to improve the touch sensitivity of a touch panel, and an organic light-emitting display device including the same.

BACKGROUND ART

An organic layer material, an electrode, etc., constituting an organic light-emitting device has a problem in that its light emitting characteristics and lifespan are degraded by external moisture or oxygen. Therefore, a protective layer capable of protecting the organic material and electrode is required. In order to effectively block external moisture or oxygen, such a protective layer is usually formed in a stacked structure of one or more organic layers and inorganic layers.

Recently, many capacitive touch panels to which organic light-emitting devices are applied have been adopted. Such a capacitive touch panel senses a touch by a change in capacitance when a conductor contacts the touch panel, and in a case of a high dielectric constant material, when an external electric field is applied, a lot of polarization is generated and thus it tends to reduce the touch sensitivity. Therefore, it is required to develop a composition for encapsulating an organic layer used in a stacked structure having low dielectric constant characteristics with excellent touch sensitivity of a touch panel.

DISCLOSURE

Technical Problem

An objective of the present invention is to provide a composition for encapsulating an organic light-emitting device having low dielectric constant characteristics so as to secure the performance and lifespan of the organic light-emitting device as well as to have the touch sensitivity of a touch panel being excellent by effectively blocking moisture or oxygen flowing into the organic light-emitting display device from the outside, and to provide an organic light-emitting display device including the composition.

Technical Solution

In order to accomplish the above objective, the present invention provides a composition for encapsulating an organic light-emitting device having a dielectric constant of 3.0 or less at a frequency in the range of 100 Khz to 1 MHz including two or more different photocurable monomers and photopolymerization initiators, wherein the photocurable monomers are selected from the group consisting of a mono(meth)acrylate represented by Chemical Formula 1 below; and di(meth)acrylate represented by Chemical Formula 2 below.

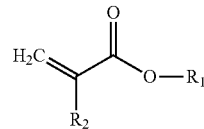

Chemical Formula 1

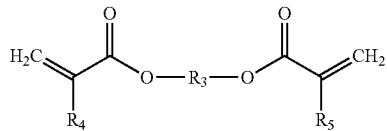

Chemical Formula 2

In Chemical Formula 1,
R$_1$ is selected from the group consisting of a substituted or unsubstituted C$_{2-20}$ alkyl group, a substituted or unsubstituted C$_{6-20}$ aryl group, a substituted or unsubstituted C$_{2-20}$ alkyloxy group, and a substituted or unsubstituted C$_{6-20}$ aryloxy group,
R$_2$ is selected as one of hydrogen, a substituted or unsubstituted C$_{1-60}$ alkyl group, a substituted or unsubstituted C$_{3-30}$ cycloalkyl group, a substituted or unsubstituted C$_{2-60}$ alkenyl group, and a substituted or unsubstituted C$_{1-60}$ alkoxy group and hydroxy group.

In Chemical Formula 2,
R$_3$ is a substituted or unsubstituted C$_{10-20}$ alkylene group,
R$_4$ and R$_5$ are respectively and independently selected as one of hydrogen, a substituted or unsubstituted C$_{1-60}$ alkyl group, a substituted or unsubstituted C$_{3-30}$ cycloalkyl group, a substituted or unsubstituted C$_{2-60}$ alkenyl group, and a substituted or unsubstituted C$_{1-60}$ alkoxy group and hydroxy group.

The composition for encapsulating the organic light-emitting device may have a viscosity of 10 to 30 cPs.

The photocurable monomer may be included in an amount of 20% to 99% by weight based on the total weight of the composition.

The mono(meth)acrylate may be one or more selected from the group consisting of decyl(meth)acrylate, isodecyl(meth)acrylate, 4-methyl-2-propylhexyl(meth)acrylate, isobornyl(meth)acrylate, dodeyl(meth)acrylate, pentadecyl(meth)acrylate, hexadecyl(meth)acrylate, octadecyl(meth)acrylate, isooctadecyl(meth)acrylate, 2-heptyl undecyl(meth)acrylate, dicyclopentanyl(meth)acrylate, adamantyl(meth)acrylate, adamantyl propyl(meth)acrylate, ethyl adamantyl(meth)acrylate, methyl adamantyl(meth)acrylate, isobornyl(meth)acrylate, ethyl tricyclo decyl(meth)acrylate, methyl tricyclo decyl(meth)acrylate, 2-phenoxyethyl(meth)acrylate, and 2-phenyl phenoxyethyl(meth)acrylate.

The di(meth)acrylate may be one or more selected from the group consisting of 1,10-decanediol di(meth)acrylate, 1,9-decanediol di(meth)acrylate, 1,11-undecanediol di(meth)acrylate, 1,12-dodecanediol di(meth)acrylate, 1,13-tridecanediol di(meth)acrylate, 1,14-tetradecanediol di(meth)acrylate, 1,15-pentadecanediol di(meth)acrylate, 1,16-hexadecane diol di(meth)acrylate, 1,17-heptadecanediol di(meth)acrylate, 1,18-octadecanediol di(meth)acrylate, 1,19-nonadecanediol di(meth)acrylate, and 1,20-icosanediol di(meth)acrylate.

The photopolymerization initiator may be one or more selected from the group consisting of triazine-based, acetophenone-based, benzophenone-based, thioxanthone-based, benzoin-based, phosphorus-based, and oxime-based photopolymerization initiators, and mixtures thereof, and may be include in an amount of 0.1% to 10% by weight on the total weight of the composition.

In addition, the composition for encapsulating the organic light-emitting device may further include one or more additives selected from the group consisting of a surfactant, a curing accelerator, and an antioxidant.

Further, the present invention provides an organic light-emitting display device including an encapsulation part containing the composition for encapsulating the organic light-emitting device.

The encapsulation part may further include one or more inorganic barrier layers in addition to one or more organic barrier layers including the composition.

Advantageous Effects

When an encapsulation part of an organic light-emitting display device is formed using the composition for encapsulating an organic light-emitting device according to the present invention, it is possible to secure the performance and lifespan of the organic light-emitting device by effectively blocking moisture or oxygen flowing in from the outside, and since having low dielectric constant characteristics, the touch sensitivity of the touch panel also has an excellent effect.

DESCRIPTION OF DRAWINGS

FIG. 1 is an exemplary diagram of an organic light-emitting display device according to an embodiment of the present invention.

BEST MODE

Hereinafter, embodiments of the present invention will be described in detail with reference to the accompanying drawing.

In adding reference numerals to the components of each drawing, it should be noted that the same reference numerals are used for the same components as possible even if the same components are displayed in different drawings. In addition, in describing the present invention, if it is determined that a detailed description of a related known configuration or function may obscure the gist of the present invention, a detailed description thereof will be omitted.

MODE FOR INVENTION

When a certain component is described to be "linked", "coupled", or "connected" to other component, the component may be directly linked or connected to the other component, however, another component may be "linked", "coupled", or "connected" between each component. In addition, when a component such as a layer, film, region, plate, etc. is said to be "on" other component, this means not only when it is "directly above" other component, but also when there is another component in the middle. On the contrary, when a component is "directly above" other component, it means that there is no another component in the middle.

As used herein, the term "(meth)acryl" refers to acryl and/or methacryl.

As used herein, unless there is other explanation, the term "alkyl group" refers to a radical of a saturated aliphatic functional group having 1 to 60 of carbons linked by a single bond, and including a straight alkyl group, branched alkyl group, cycloalkyl(alicyclic) group, alkyl-substituted cycloalkyl group, cycloalkyl-substituted alkyl group.

As used herein, the term "alkyloxy group" refers to an alkyl group to which oxygen radicals are bonded.

As used herein, the term "alkylene group" refers to alkanediyl groups connected by saturated hydrocargons without a double bond, and means having two linking groups.

In addition, unless explicitly stated, as used herein, in the term "substituted or unsubstituted", "substituted" means to be substituted with one or more substituents selected from the group consisting of deuterium, halogen amino group, nitrile group, nitro group, $C_1$-$C_{20}$ alkyl group, $C_1$-$C_{20}$ alkoxy group, $C_1$-$C_{20}$ alkylamine group, $C_1$-$C_{20}$ alkylthiophene group, $C_6$-$C_{20}$ arylthiophene group, $C_2$-$C_{20}$ alkenyl group, $C_2$-$C_{20}$ alkynyl group, $C_3$-$C_{20}$ cycloalkyl group, $C_6$-$C_{20}$ aryl group, $C_6$-$C_{20}$ aryl group substituted with deuterium, $C_8$-$C_{20}$ arylalkenyl group, silane group, boron group, and $C_2$-$C_{20}$ heterocyclic group including at least one hetero atom selected from the group consisting of O, N, S, Si, and P, but is not necessarily limited to these substituents.

As used herein, the term "dielectric constant" refers to a value measured by an electric capacitance method for an organic layer including the composition for encapsulating an organic light-emitting device according to the present invention.

As used herein, the term "viscosity" refers to a value measured using a rotary viscometer for an organic layer including the composition for encapsulating an organic light-emitting device according to the present invention.

The composition for encapsulating an organic light-emitting device according to the present invention includes (a) two or more different photocurable monomers and (b) photopolymerization initiators, and has a dielectric constant of 3.0 or less at a frequency in the range of 100 Khaz to 1 MHz, and the viscosity of the composition may be 10 to 30 cPs.

(a) The two or more different photocurable monomers may be selected at least two or more from the group consisting of a mono(meth)acrylate represented by Chemical Formula 1 below and di(meth)acrylate represented by Chemical Formula 2 below.

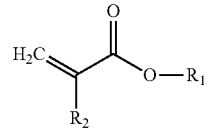

Chemical Formula 1

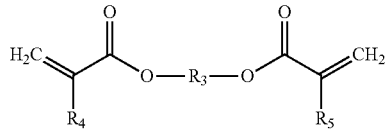

Chemical Formula 2

$R_1$ is selected from the group consisting of a substituted or unsubstituted $C_{2\text{-}20}$ alkyl group, a substituted or unsubstituted $C_{6\text{-}20}$ aryl group, a substituted or unsubstituted $C_{2\text{-}20}$ alkyloxy group, and a substituted or unsubstituted $C_{6\text{-}20}$ aryloxy group, $R_2$ is selected as one of hydrogen, a substituted or unsubstituted $C_{1\text{-}60}$ alkyl group, a substituted or unsubstituted $C_{3\text{-}30}$ cycloalkyl group, a substituted or unsubstituted $C_{2\text{-}60}$ alkenyl group, and a substituted or unsubstituted $C_{1\text{-}60}$ alkoxy group and hydroxy group, in Chemical Formula 2, $R_3$ is a substituted or unsubstituted $C_{10-20}$ alkylene group, $R_4$ and $R_5$ are respectively and independently selected as one of hydrogen, a substituted or unsubstituted $C_{1-60}$ alkyl group, a substituted or unsubstituted $C_{3-30}$ cycloalkyl group, a substituted or unsubstituted $C_{2-60}$ alkenyl group, and a substituted or unsubstituted $C_{1-60}$ alkoxy group and hydroxy group.

(a) The photocurable monomer may further include a monomer having a substituted or unsubstituted aromatic hydrocarbon group according to necessity.

It is desirable that the photocurable monomer is included in an amount of 20% to 99% by weight based on the total weight of the photocurable monomer.

More specifically, the mono(meth)acrylate may be one or more selected from the group consisting of decyl(meth)acrylate, isodecyl(meth)acrylate, 4-methyl-2-propylhexyl (meth)acrylate, isobornyl(meth)acrylate, dodeyl(meth)acrylate, pentadecyl(meth)acrylate, hexadecyl(meth)acrylate, octadecyl(meth)acrylate, isooctadecyl(meth)acrylate, 2-heptyl undecyl(meth)acrylate, dicyclopentanyl(meth)acrylate, adamantyl(meth)acrylate, adamantyl propyl(meth)acrylate, ethyl adamantyl(meth)acrylate, methyl adamantyl(meth)acrylate, isobornyl(meth)acrylate, ethyl tricyclo decyl(meth)acrylate, methyl tricyclo decyl(meth)acrylate, 2-phenoxyethyl(meth)acrylate, and 2-phenyl phenoxyethyl(meth)acrylate, but is not necessarily limited thereto.

In addition, the di(meth)acrylate may be one or more selected from the group consisting of 1,10-decanediol di(meth)acrylate, 1,9-decanediol di(meth)acrylate, 1,11-undecanediol di(meth)acrylate, 1,12-dodecanediol di(meth)acrylate, 1,13-tridecanediol di(meth)acrylate, 1,14-tetradecanediol di(meth)acrylate, 1,15-pentadecanediol di(meth)acrylate, 1,16-hexadecane diol di(meth)acrylate, 1,17-heptadecanediol di(meth)acrylate, 1,18-octadecanediol di(meth)acrylate, 1,19-nonadecanediol di(meth)acrylate, and 1,20-icosanediol di(meth)acrylate, but is not necessarily limited thereto.

The composition for encapsulating an organic light-emitting device according to the present invention includes (b) a photopolymerization initiator capable of curing the photocuring monomer through UV irradiation; etc. The photopolymerization initiator is not particularly limited as long as it is a conventional photopolymerization initiator capable of performing a photocuring reaction. For example, the photopolymerization initiator may include triazine-based, acetophenone-based, benzophenone-based, thioxanthone-based; benzoin-based, phosphorus-based, and oxime-based photopolymerization initiators, and mixtures thereof.

The triazine-based initiator may be 2,4,6-trichloro-s-triazine, 2-phenyl-4,6-bis(trichloro methyl)-s-triazine, 2-(3',4'-dimethoxy styryl)-4,6-bis(trichloro methyl)-s-triazine, 2-(4'-methoxy naphthyl)-4,6-bis(trichloro methyl)-s-triazine, 2-(p-methoxy phenyl)-4,6-bis(trichloro methyl)-s-triazine, 2-(p-tolyl)-4,6-bis(trichloro methyl)-s-triazine, 2-biphenyl-4,6-bis(trichloro methyl)-s-triazine, bis(trichloro methyl)-6-styryl-s-triazine, 2-(naphtho-1-yl)-4,6-bis(trichloro methyl)-s-triazine, 2-(4-methoxy naphtho-1-yl)-4,6-bis(trichloro methyl)-s-triazine, 2,4-trichloro methyl(piperonyl)-6-triazine, 2,4-(trichloro methyl(4'-methoxy styryl)-6-triazine, or mixtures thereof.

The acetophenone-based initiator may be 2,2'-diethoxy acetophenone, 2,2'-dibutoxy acetophenone, 2-[0230] hydroxy-2-methyl propiophenone, pt-butyl trichloro acetophenone, p-t-butyl dichloro acetophenone, 4-chloro [0231] acetophenone, 2,2'-dichloro-4-phenoxy acetophenone, 2-methyl-1-(4-(methylthio)phenyl)-2-morpholino propane-1-on, 2-benzyl-2-dimethyl amino-1-(4-morpholino phenyl)-butane-1-on, or mixtures thereof.

The benzophenone-based initiator may be benzophenone, benzoyl benzoic acid, methyl benzoyl benzoate, 4-phenyl benzophenone, hydroxy benzophenone, acrylated benzophenone, bis(dimethyl amino)benzophenone, 4,4'-dichloro benzophenone, 3,3'-dimethyl-2-methoxy benzophenone or mixtures thereof.

The thioxanthone-based initiator may be thioxanthone, 2-methyl thioxanthone, isopropyl thioxanthone, 2,4-diethyl thioxanthone, 2,4-diisopropyl thioxanthone, 2-chloro thioxanthone, or a mixture thereof.

The benzoin-based initiator may be benzoin, benzoin methyl ether, benzoin ethyl ether, benzoin isopropyl ether, benzoin isobutyl ether, benzyl dimethyl ketal, or a mixture thereof.

The phosphorus-based initiator may be bisbenzoylphenyl phosphine oxide, benzoyldiphenyl phosphineoxide, or a mixture thereof.

The oxime-based initiator may be 2-(o-benzoyloxime)-1-[4-(phenylthio)phenyl]-1,2-octanedione and 1-(o-acetyloxime)-1-[9-ethyl-6-(2-methylbenzoyl)-9H-carbazole-3-yl] ethaneon, or a mixture thereof.

The photopolymerization initiator is preferably included in an amount of 0.1% to 10% by weight based on the total weight of the composition. When the photopolymerization initiator is included in the content range, photopolymerization may sufficiently occur during exposure and prevent generation of outgas and deterioration of reliability due to the unreacted initiator remained after photopolymerization.

A composition for encapsulating the organic light-emitting device according to the present invention may further include one or more additives selected from the group consisting of a surfactant, curing accelerator, and antioxidant. In particular, surfactant is advantageous for inducing dispersion of the composition.

Since the composition for encapsulating an organic light-emitting device according to the present invention has low dielectric constant characteristics of a dielectric constant of 3.0 or less at a frequency in the range of 100 Khaz to 1 MHz, when the composition for encapsulating is applied to a touch panel, it has a very excellent effect of touch sensitivity.

In addition, it is desirable that the composition for encapsulating an organic light-emitting device according to the present invention has a viscosity of 10 to 30 cPs, because the processability of the composition may be further improved in the viscosity range.

An organic light-emitting display device according to another embodiment of the present invention includes an encapsulation part containing the composition for encapsulating an organic light-emitting device.

FIG. 1 is an exemplary diagram of an organic light-emitting display device according to an embodiment of the present invention. The organic light-emitting display device illustrated in FIG. 1 includes a substrate (110), an organic it-emitting device (200) disposed on the substrate (110), and an encapsulating part (300) disposed on the organic light-emitting device (200). At this time, the encapsulation part (300) is disclosed as a multi-layer consisting of a first encapsulation layer (310) and a second encapsulation layer (320); however, the present invention can include all the configurations in which the encapsulation part (300) has two or four or more layers. When the encapsulation part (300) is formed of two multi-layers, it may include an inorganic barrier layer and an organic barrier layer. For example, when the first encapsulation layer (310) is an inorganic barrier layer, the second encapsulation layer (320) may be an organic barrier layer however, the stacking order is not limited thereto.

The encapsulation part (300) may form an organic barrier layer for encapsulating an organic light-emitting display device, and the organic barrier layer may be formed by photocuring the composition for encapsulating an organic light-emitting device according to the present invention.

The composition for encapsulation (organic barrier layer material) may be applied by inkjet, vacuum deposition, spin coating, or slit coating method, and an initiator may be used when photocuring.

Hereinafter, a better understanding of the present invention may be obtained through the following examples which are set forth to illustrate a composition for encapsulating an organic light-emitting device according to the present invention, but are not to be construed as the limit of the present invention.

EXAMPLE

Two or more different photocurable monomers, photo initiators (BAPO), and surfactants were mixed in the weight ratio of Table 1 below to prepare the compositions for encapsulating organic light-emitting devices of Examples 1 to 46 and Comparative Examples 1 to 2.

Then, the prepared compositions were stirred for 12 hours, and filtered through a pore size: 0.45 μm PTFE filter.

After the filtered composition for encapsulating an organic light-emitting device was formed to a thickness of 5.0 μm or more by spin coating, the composition was irritated by an amount of light of 1J using a UV exposure system to form an encapsulation film. The dielectric constant and viscosity were measured by the following method.

Dielectric constant: The composition for encapsulating an organic light-emitting device was coated and cured on the lower electrode to a thickness of 5.0 μm or more. After that, the upper electrode was deposited to a thickness of 1,000 Å. After measuring the prepared specimen with E4980A, KEYSIGHT, the dielectric constant was calculated.

Viscosity: The viscosity of the composition for encapsulating a liquid organic light-emitting device was measured using a rotary viscometer.

As a result, all the dielectric constants of the encapsulation films formed with the compositions for encapsulating organic light-emitting devices according to Examples 1 to 46 of the present invention were 3.0 F/m or less, however, the dielectric constants of the encapsulation films formed with Comparative Examples 1 to 2 exceeded 3.0 F/m. Therefore, in the case of the touch panel to which the encapsulation film prepared according to the present invention is applied, an effect of better touch sensitivity can be obtained.

TABLE 1

| | | photocurable monomer | | | | | | | | | | photopolymerization initiator | surfactant | dielectric constant [F/m] | viscosity [cPs] | surface tension [mN/m] | transmissivity [%] |
|---|---|---|---|---|---|---|---|---|---|---|---|---|---|---|---|---|---|
| | | DDMA | ISBA | OPPEA | HFB-MA | L-DAIC | FA-512M | FA-512AS | TDMA | ISTA | PHEA | U-847 | | | | | | |
| Example | 1 | 60 | — | — | — | 40 | — | — | — | — | — | — | 2.0 | 0.1 | 2.9 | 25.7 | 32.1 | 99 |
| | 2 | 70 | — | — | — | 30 | — | — | — | — | — | — | 2.0 | 0.1 | 2.8 | 23.2 | 32.5 | 99 |
| | 3 | 80 | — | — | — | 20 | — | — | — | — | — | — | 2.0 | 0.1 | 2.8 | 20.7 | 33.8 | 99 |
| | 4 | 90 | — | — | — | 10 | — | — | — | — | — | — | 2.0 | 0.1 | 2.8 | 18.2 | 33.9 | 99 |
| | 5 | — | 75 | — | — | 25 | — | — | — | — | — | — | 2.0 | 0.1 | 2.9 | 19.8 | 33.2 | 99 |
| | 6 | — | 70 | — | — | 30 | — | — | — | — | — | — | 2.0 | 0.1 | 2.9 | 21.3 | 33.1 | 99 |
| | 7 | — | 65 | — | — | 35 | — | — | — | — | — | — | 2.0 | 0.1 | 2.9 | 22.8 | 33.7 | 99 |
| | 8 | — | 60 | — | — | 40 | — | — | — | — | — | — | 2.0 | 0.1 | 2.9 | 24.3 | 34 | 99 |
| | 9 | 60 | — | 30 | 10 | — | — | — | — | — | — | — | 2.0 | 0.1 | 3.0 | 16.4 | 32.1 | 99 |
| | 10 | 50 | — | 40 | 10 | — | — | — | — | — | — | — | 2.0 | 0.1 | 3.0 | 18.1 | 31.8 | 99 |
| | 11 | 40 | — | 50 | 10 | — | — | — | — | — | — | — | 2.0 | 0.1 | 3.0 | 20.7 | 32.7 | 99 |
| | 12 | — | — | 30 | 70 | — | — | — | — | — | — | — | 2.0 | 0.1 | 2.7 | 10.1 | 30.3 | 99 |
| | 13 | — | — | 40 | 60 | — | — | — | — | — | — | — | 2.0 | 0.1 | 2.7 | 11.3 | 30.4 | 99 |
| | 14 | — | — | 50 | 50 | — | — | — | — | — | — | — | 2.0 | 0.1 | 2.8 | 12,5 | 30.7 | 99 |
| | 15 | — | — | — | 10 | — | 30 | — | 60 | — | — | — | 2.0 | 0.1 | 2.9 | 13.2 | 31.6 | 99 |
| | 16 | — | — | — | 10 | — | 40 | — | 50 | — | — | — | 2.0 | 0.1 | 2.9 | 15.5 | 31.5 | 99 |
| | 17 | — | — | — | 10 | — | 50 | — | 40 | — | — | — | 2.0 | 0.1 | 3.0 | 17.3 | 31.9 | 99 |
| | 18 | — | — | — | 15 | — | 25 | — | 60 | — | — | — | 2.0 | 0.1 | 2.8 | 11.5 | 32.5 | 99 |
| | 19 | — | — | — | 15 | — | 35 | — | 50 | — | — | — | 2.0 | 0.1 | 2.8 | 13.6 | 31.1 | 99 |
| | 20 | — | — | — | 15 | — | 45 | — | 40 | — | — | — | 2.0 | 0.1 | 2.8 | 14.9 | 34.5 | 99 |
| | 21 | — | — | — | 10 | — | — | 30 | 60 | — | — | — | 2.0 | 0.1 | 2.9 | 14.8 | 33.7 | 99 |
| | 22 | — | — | — | 10 | — | — | 40 | 50 | — | — | — | 2.0 | 0.1 | 2.9 | 16.5 | 33.4 | 99 |
| | 23 | — | — | — | 10 | — | — | 50 | 40 | — | — | — | 2.0 | 0.1 | 3.0 | 18.1 | 33.1 | 99 |
| | 24 | — | — | — | 15 | — | — | 25 | 60 | — | — | — | 2.0 | 0.1 | 2.8 | 12.7 | 33.8 | 99 |
| | 25 | — | — | — | 15 | — | — | 35 | 50 | — | — | — | 2.0 | 0.1 | 2.8 | 14.6 | 33.6 | 99 |
| | 26 | — | — | — | 15 | — | — | 45 | 40 | — | — | — | 2.0 | 0.1 | 2.8 | 15.5 | 33.7 | 99 |
| | 27 | — | — | — | — | 10 | — | — | 90 | — | — | — | 2.0 | 0.1 | 2.9 | 19.4 | 32.5 | 99 |
| | 28 | — | — | — | — | 15 | — | — | 85 | — | — | — | 2.0 | 0.1 | 2.9 | 21.3 | 32.3 | 99 |
| | 29 | — | — | — | — | 20 | — | — | 80 | — | — | — | 2.0 | 0.1 | 2.9 | 22.8 | 32.9 | 99 |
| | 30 | — | — | — | — | 25 | — | — | 75 | — | — | — | 2.0 | 0.1 | 2.8 | 24.9 | 32.6 | 99 |
| | 31 | — | — | — | — | 30 | — | — | 70 | — | — | — | 2.0 | 0.1 | 2.8 | 26.1 | 32.9 | 99 |
| | 32 | — | — | — | — | 35 | — | — | 65 | — | — | — | 2.0 | 0.1 | 2.7 | 28.4 | 33.7 | 99 |
| | 33 | — | — | — | — | 40 | — | — | 60 | — | — | — | 2.0 | 0.1 | 2.7 | 29.8 | 32.1 | 99 |
| | 34 | — | — | — | — | 10 | — | — | — | 90 | — | — | 2.0 | 0.1 | 2.5 | 21.8 | 33.5 | 99 |
| | 35 | — | — | — | — | 30 | — | — | — | 70 | — | — | 2.0 | 0.1 | 2.5 | 18.7 | 33 | 99 |
| | 36 | — | — | — | — | 50 | — | — | — | 50 | — | — | 2.0 | 0.1 | 2.9 | 16.9 | 32.7 | 99 |
| | 37 | — | — | — | — | 70 | — | — | — | 30 | — | — | 2.0 | 0.1 | 3.0 | 15.1 | 32.4 | 99 |
| | 38 | — | 75 | — | — | — | — | — | — | 25 | — | — | 2.0 | 0.1 | 2.8 | 10.3 | 30.1 | 99 |

TABLE 1-continued

| | | photocurable monomer | | | | | | | | | | photo-poly-meri-zation initiator | sur-factant | di-elec-tric con-stant [F/m] | vis-cos-ity [cPs] | sur-face ten-sion [mN/m] | trans-miss-ivity [%] |
|---|---|---|---|---|---|---|---|---|---|---|---|---|---|---|---|---|---|
| | | DDMA | ISBA | OPPEA | HFB-MA | L-DAIC | FA-512M | FA-512AS | TDMA | ISTA | PHEA | U-847 | | | | | |
| | 39 | — | 70 | — | — | — | — | — | — | 30 | — | — | 2.0 | 0.1 | 2.7 | 11.2 | 30.4 | 99 |
| | 40 | — | 65 | — | — | — | — | — | — | 35 | — | — | 2.0 | 0.1 | 2.7 | 11.5 | 30.6 | 99 |
| | 41 | — | 60 | — | — | — | — | — | — | 40 | — | — | 2.0 | 0.1 | 2.6 | 12.5 | 30.5 | 99 |
| | 42 | — | 30 | — | — | — | 10 | — | — | 60 | — | — | 2.0 | 0.1 | 2.8 | 16.4 | 30.9 | 99 |
| | 43 | — | 25 | — | — | — | 10 | — | — | 65 | — | — | 2.0 | 0.1 | 2.8 | 17.6 | 31.6 | 99 |
| | 44 | — | 20 | — | — | — | 10 | — | — | 70 | — | — | 2.0 | 0.1 | 2.7 | 18.8 | 31.7 | 99 |
| | 45 | — | 15 | — | — | — | 10 | — | — | 75 | — | — | 2.0 | 0.1 | 2.6 | 20.3 | 31.4 | 99 |
| | 46 | — | 10 | — | — | — | 10 | — | — | 80 | — | — | 2.0 | 0.1 | 2.6 | 21.2 | 31 | 99 |
| Comparative Examples | 1 | 65 | — | — | — | — | — | — | — | — | — | 35 | 2.0 | 0.1 | 3.5 | 35.1 | 39.1 | 99 |
| | 2 | 65 | — | — | — | — | — | — | — | — | 35 | — | 2.0 | 0.1 | 3.5 | 33.5 | 40.2 | 99 |

\* DDMA: 1,12-Dodecanediol Dimethacrylate (72829-09-5)
\* ISBA: Isobornyl Acrylate (5888-33-5)
\* OPPEA: 2-Phenylphenoxyethyl acrylate (91442-24-9)
\* HFB-MA: 2,2,3,4,4,4-Hexafluorobuyl methacrylate (36405-47-7)
\* L-DAIC: 1,3-diallyl-5-dodecyl-1,3,5-triazinane-2,4,6-trione (66747-68-0)
\* FA-513AS: Octahydro-4,7-methano-1H-indenyl acrylate (79637-74-4)
\* FA-513M: Dicyclopentanyl methacrylate (34759-34-7)
\* TDMA: 1,14-Tetradecanediol dimethacrylate (168473-14-1)
\* ISTA: Isooctadecyl acrylate (93841-48-6)
\* PHEA: 2-Phenoxyethyl Acrylate (48145-04-6)
\* U-847: 2-Propenoic acid, 2-methyl-,1,1'[(3-heptyl-4-pentyl-1,2-cyclohexanediyl)bis(9,1-nonanediyliminocarbonyloxy-2,1- ethanediyl)]ester (86499-57-3)

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Therefore, the examples disclosed herein are not intended to limit but to describe the present invention, and the spirit and scope of the present invention are not limited by the examples. The scope of protection of the present invention should be construed by the following claims, and all technologies within the scope equivalent thereto should be construed as being included in the scope of the present invention.

DESCRIPTION OF THE REFERENCE NUMERALS IN THE DRAWINGS

100: substrate
200: organic light emitting device
300: encapsulation part
310: first encapsulation part
320: second encapsulation part

The invention claimed is:

1. A composition for encapsulating an organic light emitting device, the composition having a dielectric constant of 3.0 or less at a frequency in the range of 100 Khz to 1 MHz, the composition comprising two or more different photocurable monomers and a photopolymerization initiator; wherein the photocurable monomers are selected from the group consisting of isobornyl(meth)acrylate, isooctadecyl(meth)acrylate, dicyclopentanyl(meth)acrylate, 2-phenoxyethyl(meth)acrylate, 1,14-tetradecanediol di(meth)acrylate, and 1,3-diallyl-5-dodecyl-1,3,5-triazinane-2,4,6-trione (L-DAIC).

2. The composition of claim 1, wherein the composition has a viscosity of 10 to 30 cPs.

3. The composition of claim 1, wherein the photocurable monomer is included in an amount of 20% to 99% by weight based on the total weight of the composition.

4. The composition of claim 1, wherein the photopolymerization initiator is one or more selected from the group consisting of triazine-based, acetophenone-based, benzophenone-based, thioxanthone-based, benzoin-based, phosphorus-based, and oxime-based photopolymerization initiators, and mixtures thereof.

5. The composition of claim 1, wherein the photopolymerization initiator is include in an amount of 0.1% to 10% by weight based on the total weight of the composition.

6. The composition of claim 1, wherein the composition further comprises one or more additives selected from the group consisting of a surfactant, a curing accelerator, and an antioxidant.

7. An organic light emitting display device comprising an encapsulation part containing the composition of claim 1.

\* \* \* \* \*